(12) United States Patent
Schelten et al.

(10) Patent No.: US 6,429,498 B1
(45) Date of Patent: Aug. 6, 2002

(54) SENSOR FOR MEASURING A MAGNETIC FIELD

(75) Inventors: Jakob Schelten; Ralf Lehmann, both of Jülich (DE)

(73) Assignee: Forschungszentrum Jülich GmbH, Jülich (DE)

( * ) Notice: Subject to any disclaimer, the term of this patent is extended or adjusted under 35 U.S.C. 154(b) by 0 days.

(21) Appl. No.: 09/763,878

(22) PCT Filed: Aug. 19, 1999

(86) PCT No.: PCT/DE99/02605

§ 371 (c)(1),
(2), (4) Date: Feb. 28, 2001

(87) PCT Pub. No.: WO00/13205

PCT Pub. Date: Mar. 9, 2000

(30) Foreign Application Priority Data

Sep. 1, 1998 (DE) .......................................... 198 39 671

(51) Int. Cl.[7] .......................... H01L 29/82; H01L 43/00; H01L 31/075; H01L 31/105
(52) U.S. Cl. .......................... 257/421; 257/425; 257/656
(58) Field of Search ................................ 257/421, 424, 257/427, 425, 656

(56) References Cited

U.S. PATENT DOCUMENTS 5,808,349 A * 9/1998 Papadopoulos ............. 257/421

FOREIGN PATENT DOCUMENTS

EP 0413154 2/1991

* cited by examiner

Primary Examiner—Ngân V. Ngô

(57) ABSTRACT

The invention relates to a sensor for measuring a magnetic field. The inventive sensor has a high level of measuring sensitivity compared to a Hall probe, comprising several electrically semiconductive layers. The layers are arranged in the form of a power diode connected in the reverse direction, consisting of an anode layer, a cathode layer and an intrinsically conductive layer enclosed between the two. The anode layer is subdivided by insulation sections into several anode layer areas, these areas being insulated from each other. The cathode layer has an injector area on the areas opposite the insulation sections which is oppositely doped. An electron beam is formed between the injector area and the anode by applying an injection voltage to the injector area. The electron beam is distributed across the areas of the earthed anode layer areas in the form of uniform partial currents. The electron beam is diverted by a magnetic field which forms in the intrinsically conductive layer, resulting in partial currents of different strengths on the earthed anode layer areas. The magnetic field can then be evaluated by measuring these differences in strength between the partial currents.

8 Claims, 4 Drawing Sheets

SENSOR FOR MEASURING A MAGNETIC FIELD

FIELD OF THE INVENTION

The present invention relates to a sensor for measuring a magnetic field which comprises several electrically semiconductive layers.

BACKGROUND OF THE INVENTION

Sensors for measuring a magnetic field are used in many fields today. They are, for example, used in automation, control and measuring technology in order to measure distances in a contact-free manner, to ascertain speeds or to test positionings. In information technology, miniaturized magnetic field sensors read digital data which are, for example, magnetically stored on hard drives. Sensitive magnetic field sensors are used in non-destructive material testing in order to detect material defects. In medical diagnostics, highly sensitive sensors are used to quantitatively record biomagnetism.

The sensors must meet quite a few different requirements corresponding to the diversity of applications. This can be accomplished with sensors which consist of different materials (such as metals, semiconductors or superconductors and which are based on different physical principles.

The individual sensors can thereby be roughly divided into the following types:
- field plates, Hall probes, magnetic diodes and magnetic transistors consisting of semiconductors;
- magnetic resistive homogeneous or granular layers and layer systems consisting of metals and insulators;
- SQUIDS consisting of superconductors The types of sensors used most often are:
[1] field plates consisting of InSb with NiSb needles,
[2] Hall probes made of silicon or III/V semiconductors,
[3] magnetic resistive AMR sensors which consist of a homogeneous thin magnetic metal layer of, for example, NiFe,
[4] GMR sensors which consist of at least two magnetic metal layers and a non-magnetic metal layer and
[5] SQUIDS consisting of the superconductors Nb or YBCO whose operating temperature is at 4K or 80K, respectively.

The sensitivity of the sensors vis-à-vis a magnetic field or a change in the magnetic field increases continuously from the top to the bottom in the above arrangements.

The following is noted briefly about the mode of operation of the individual types of sensors:

The reason for the change in resistance in the field plates [1] and for the Hall voltage [2] is the Lorentz force which is produced at electrical charges when they move in the magnetic field.

In AMR sensors [3], the change in resistance is based on a magnetic scattering of the conduction electrons which changes with the direction of the magnetizing relative to the direction of the current.

In the GMR [4], the action is again based on an anisotropic scattering at the contact surfaces which depends on the angle that both magnetizations form with one another.

In the SQUIDS [5], the magnetic behaviour is determined by the principle that the magnetic flow in a superconductive ring must be an integral multiple of the elementary flow quantum.

SUMMARY OF THE INVENTION

The object of the present invention is to create a sensor for measuring a magnetic field which is very sensitive and, as a result, can already be used to measure the smallest magnetic fields or to measure the changes in magnetic fields. Moreover, it should be able to operate at room temperature and not exhibit any hysteresis manifestations.

This object is solved with the sensor of the invention according to claim 1 which consists of several electrically semiconductive layers which are arranged in the form of a diode or pin diode connected in reverse direction. This layer arrangement comprises an anode layer, a cathode layer and an intrinsically conductive layer enclosed between the two. The anode layer is subdivided by insulation sections, for example in the form of insulating strips, into several anode layer areas that are insulated from one another. The cathode layer has an injector area on the areas opposite the insulation sections which is oppositely doped. The anode layer and the cathode layer are connected with an inverse voltage, so that the layer arrangement is biased in reverse direction. An injection voltage is applied to the injector area in the cathode layer. As a result, an electron beam is formed between the injector area and the anode thereby that injected electrons move from the injector area on the cathode to the anode lying opposite thereto. A distribution of the electron beam takes place thereby due to thermal diffusion. This distributed electron beam now uniformly strikes the individual anode layer areas insulated from one another. The anode layer areas are individually earthed by respective current measuring devices. Thus, depending on the number of anode layer areas, a corresponding part of the entire electron beam will strike every single anode layer area. This part of the electron beam can be measured in the form of a current with the respective current measuring device.

If a magnetic field is now applied in the intrinsically conductive layer diagonally to the direction of dispersion of the electron beam which extends between injector area and anode layer, the Lorentz force is then exerted on the drifting electrons which results in a diversion of the electron beam. This diversion of the electron beam leads thereto that other partial amounts of the entire electron beam now strike the individual anode layer areas insulated from one another, which results in a corresponding change of the partial current of the anode layer areas. The magnetic field can be calculated from this change of the partial currents.

BRIEF DESCRIPTION OF THE DRAWINGS

The construction and mode of functioning of the sensor according to the invention for measuring a magnetic field will be described in greater detail in the following by way of two embodiments with reference to the drawings, showing.

DETAILED DESCRIPTION OF THE PREFERRED EMBODIMENTS

Figure 1:
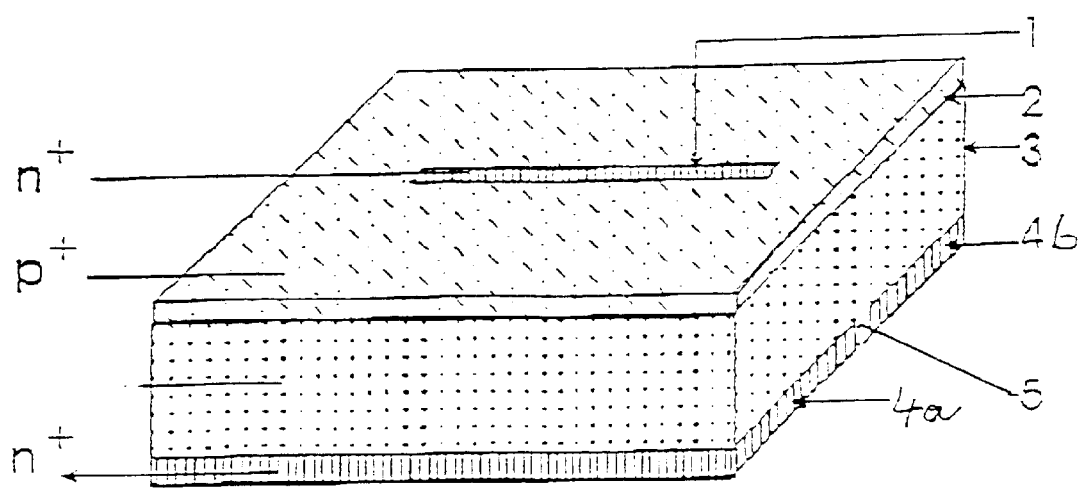
FIG. 1 a three-dimensional view of the sensor according to the invention.

FIG. 1 shows a three-dimensional view of the sensor according to the invention for measuring a magnetic field. It consists of a layer packet of electrically semiconductive layers. The uppermost layer is the cathode layer 2 which, in this example, consists of a $p^+$ doped layer. The lowermost layer is the anode layer 4 which, in this example, consists of an n⁺ doped layer. An intrinsically conductive layer 3 is situated between these layers.

The anode layer 4 is subdivided into several anode layer areas insulated from one another. In the example shown here, the anode layer 4 is subdivided into two anode layer areas 4a and 4b. An insulation section 5 is placed between the anode layer areas 4a and 4b for mutual insulation of these areas, said insulation section 5 being configured in the form of an insulating strip in this embodiment.

The cathode layer 2 has a so-called injector area 1 in the area opposite the insulation section 5 of the anode layer 4. In this case, it has n⁺ doping.

Figure 2:
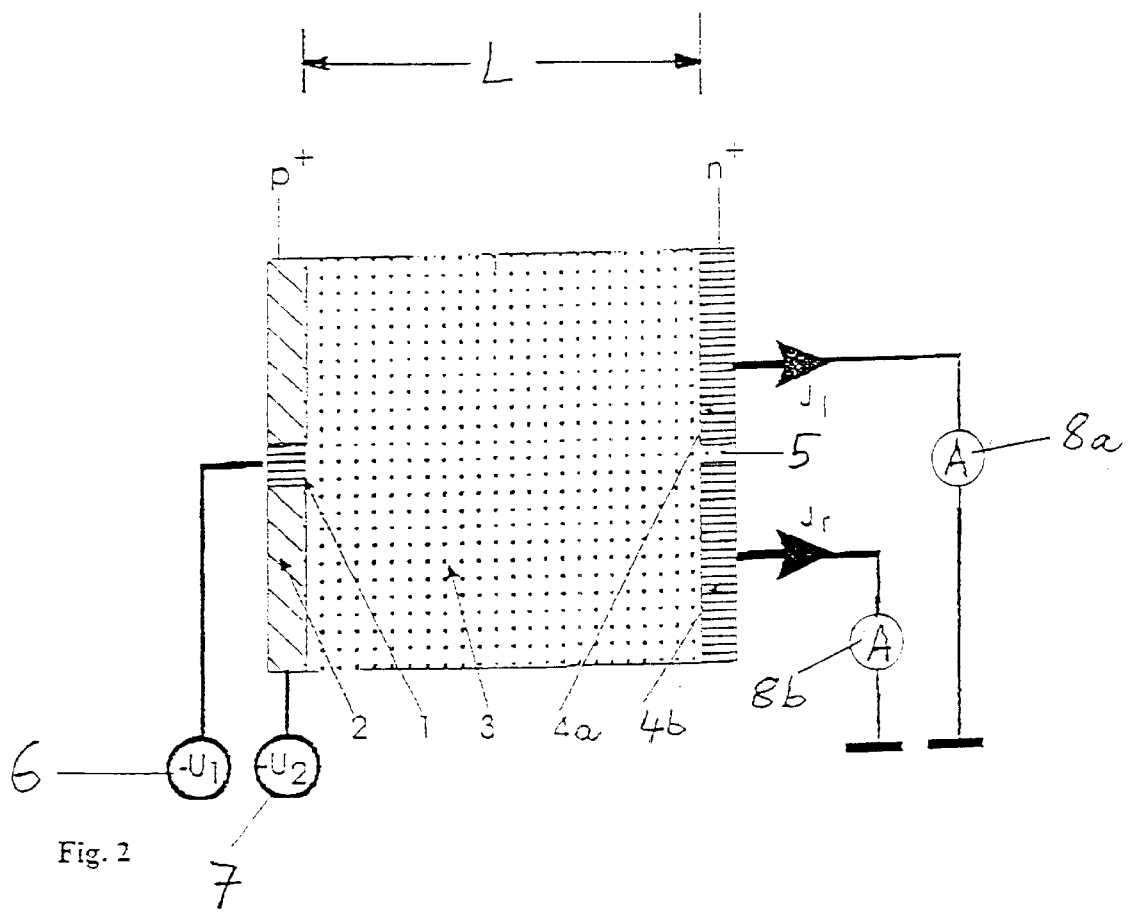
FIG. 2 a cross section of the sensor according to the invention with applied voltage supply.

FIGS. 2 now shows how this layer packet of the sensor according to the invention is electrically connected. The layer packet is shown in cross section in this case. The p⁺ doped cathode layer 2, into which the n⁺ doped injector area 1 is inserted in the middle, can be seen on the left side. The two anode layer areas 4a and 4b, which are insulated from one another by the insulation section 5, are shown on the right side. The intrinsically conductive layer 3 is found between anode and cathode. The individual anode layer areas 4a, 4b are each earthed via current measuring devices 8a and 8b, schematically indicated here. The current flowing through the current measuring device of the upper anode layer area 4a is thereby indicated with $J_1$, and the current flowing through the current measuring device of the lower anode layer area 4b is indicated with $J_r$.

An inverse voltage source 7 is now connected with the cathode layer 2, as a result of which the negative voltage $-U_2$ is here applied. In conventional materials for the intrinsically conductive layer, whereby it has a residual conductivity of about $10^{-4}\ \Omega^{-1}\ cm^{-1}$ and a thickness of 500 μn, the inverse voltage is about 100 V. An injection voltage source 6 is now connected with the injector area 1, as a result of which the negative voltage $-U_1$ is applied to this area. It is selected in such a way that it is slightly lower than the cathode potential.

Figure 3:
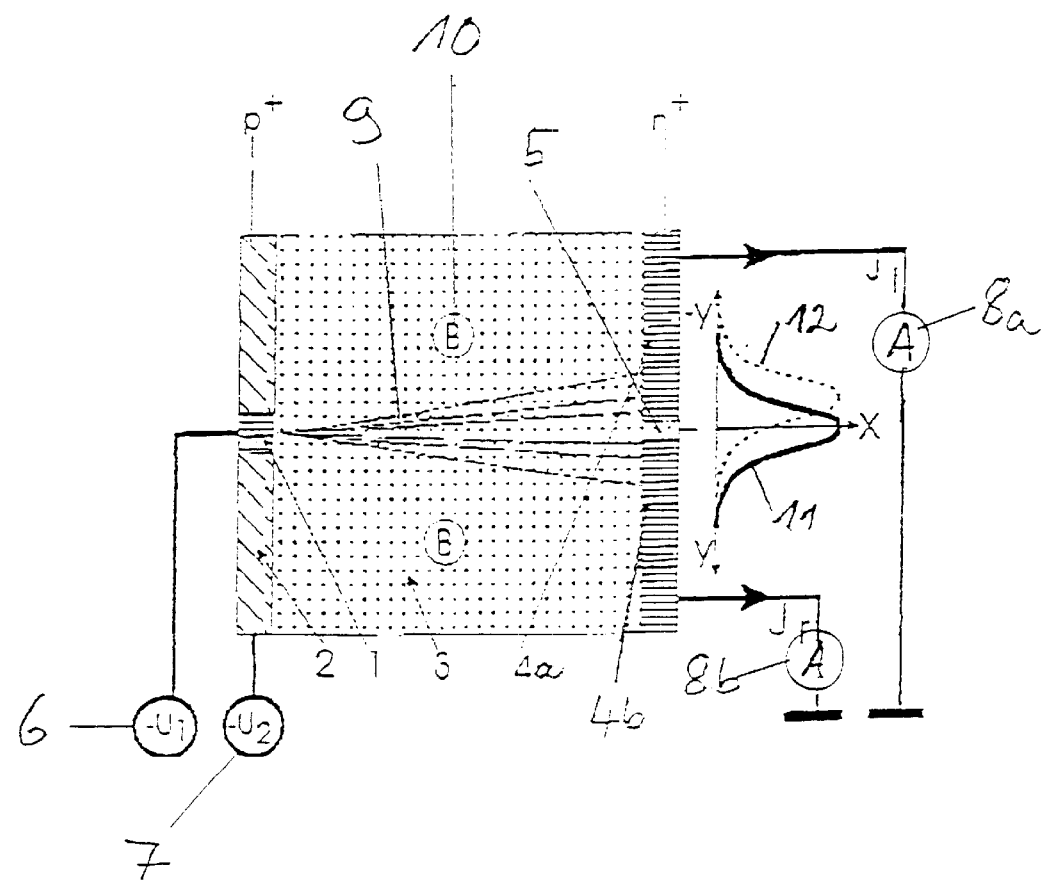
FIG. 3 a view as in FIG. 2 wherein, in addition, the course of the electron beam and the magnetic field are shown.

The function of the sensor according to the invention will now be explained with reference to FIG. 3. FIG. 3 shows the same view as FIG. 2. In addition, the path of the electron beam and the magnetic field have now been drawn in.

By applying the inverse voltage $U_2$, an electrical field having the strength $$E = U_2/L \tag{1}$$

is configured between cathode layer 2 and anode layer 4. L thereby designates the thickness of the intrinsically conductive layer 3.

By applying the injector voltage $U_1$, an electron beam 9 now forms between the injector area 1 and the anode layer 4 consisting of the anode layer areas 4a and 4b, thereby that electrons injected from the injector area 1 drift to the anode layer 4. The drift speed $V_D$ of the electrons is given by the mobility $\mu_e$ of the electrons and by the prevailing electrical field $E_x$:

$$V_D = \mu_e E_x \tag{2}$$

Thus, the drift time $t_D$ over the distance between cathode and anode is:

$$t_D = L/v_D \tag{3}$$

During this time, the drifting electron beam 9 spreads due to thermal diffusion. This is shown in FIG. 3 by an expansion of the electron beam 9 on its path from the left cathode layer 2 to the right anode layer 4. There is a bell-shaped charge distribution as indicated by the continuous curve 11. The charge distribution on the anode layer thereby has a variance $<y^2>^{1/2}$, which is calculated as follows:

$$<Y^2>^{1/2} = (D\ t_D)^{1/2} \tag{4}$$

Using the Einstein correlation $$\mu_e = (q/kT)D \tag{5}$$

and with the previous equations (1) to (3), one obtains $$<y^2>^{1/2} = (kT/qU_2)^{1/2} L \tag{6}$$

wherein in these equations, k designates the Boltzmann constant, T the temperature and q the elemental charge of the electrons.

At a room temperature of 300 K, with the inverse voltage of $U_2 = 100$ V and with a thickness L of the intrinsically conductive layer of L=300 μm, an expansion of the electron beam having the variance $<y^2>^{1/2} = 4.8$ μm is obtained and at a thickness L of 500 μm, an expansion with the variance $<y^2>^{1/2} = 8$ μm.

These quantities of the beam expansion determine the width of the injector area 1 and the width of the insulation section 5. In fact, these may at the most exhibit the expansion $<y^2>^{1/2}$. However, this is easy to attain with the aforementioned sample numerical quantities.

Since the injector area 1 of the cathode layer 2 is situated exactly opposite the insulation section 5 of the anode layer 4 and the anode layer 4 is subdivided into two equally large anode layer halves 4a and 4b, this symmetrical arrangement results in two equally large currents $J_1$, and $J_r$ in the anode layer halves 4a or 4b, respectively. These currents are measured with the current measuring devices 8a or 8b.

If a magnetic field 10 having the quantity B is now applied at right angles to the direction of expansion of the electron beam 9 in the intrinsically conductive layer 3, then the electron beam is diverted. The Lorentz force which acts as an electric transverse field Ey is exerted onto the electrons drifting in the electron beam:

$$Ey = (\mu_e B)E_x \tag{7}$$

This results in a diversion $y_B$ for the electrons entering the anode layer 4:

$$y_B = (\mu_e B)L \tag{8}$$

In the example shown, this results in an upward shifted curve of the charge distribution at the anode layer 4, as is indicated by the broken charge distribution curve 12 in FIG. 3. As a result, the current $J_1$ of the anode layer area 4a is enlarged and the current $J_r$ of the anode layer area 4b is reduced. Thus, the symmetry of the current is disturbed.

When the diversion $y_B$ of the electron beam 9 on the anode layer 4 becomes comparable with the variance $<y^2>^{1/2}$ of the electron beam distribution, then the asymmetry, given by the current quotients $Q_J(B)$:

$$Q_J(B) = (J_r - J_1)/(J_r + J_1) \tag{9}$$

becomes clear and $Q_J(B)$ almost assumes the value 1.

The magnetic field $B_1$ belongs to this:

$$B_1 = (1/\mu_e)(kT/qU_2)^{1/2} \tag{10}$$

This equation no longer includes the drift distance of the electrons, i.e. the thickness L of the intrinsically conductive layer 3. The current quotient $Q_j(B)$ has the value 0 if there is no magnetic field and it changes monotonously to the value −1 or +1 if the magnetic field changes to the value $B_1$ in accordance with equation (10).

The field sensitivity of the sensor is described by the incline:

$$\delta Q_j(B)/\delta B = 1/B_1 = \mu_e (qU_2/kT)^{1/2} \qquad (11)$$

A field sensitivity value of 6.2 $T^{-1}$ is obtained with the numerical values already noted above and the mobility $\mu_e = 1000$ cm$^2$ V$^{-1}$ s$^{-1}$ of electrons in the silicon. The corresponding quantity is, for example, in Hall probes 0.1 $T^{-1}$. Therefore, an increase in sensitivity by the factor $(qU_2/KT)^{1/2} = 62$ is obtained with the probe according to the invention in comparison to a Hall probe.

The anode layer 4 was subdivided into two equally large anode layer areas 4a and 4b, which are separated by a strip-shaped insulation section 5, in the sensor shown in the aforementioned drawings. The injector area 1 of the cathode layer 2 opposite the insulation section 5 thus also has a form like a longitudinal strip. Therefore, a sensor constructed in this way can only measure the field component of a magnetic field which extends in longitudinal direction of the injector area (in FIG. 3, this is a field component of the magnetic field which extends into the plane of the drawing or out of it).

Figure 4:
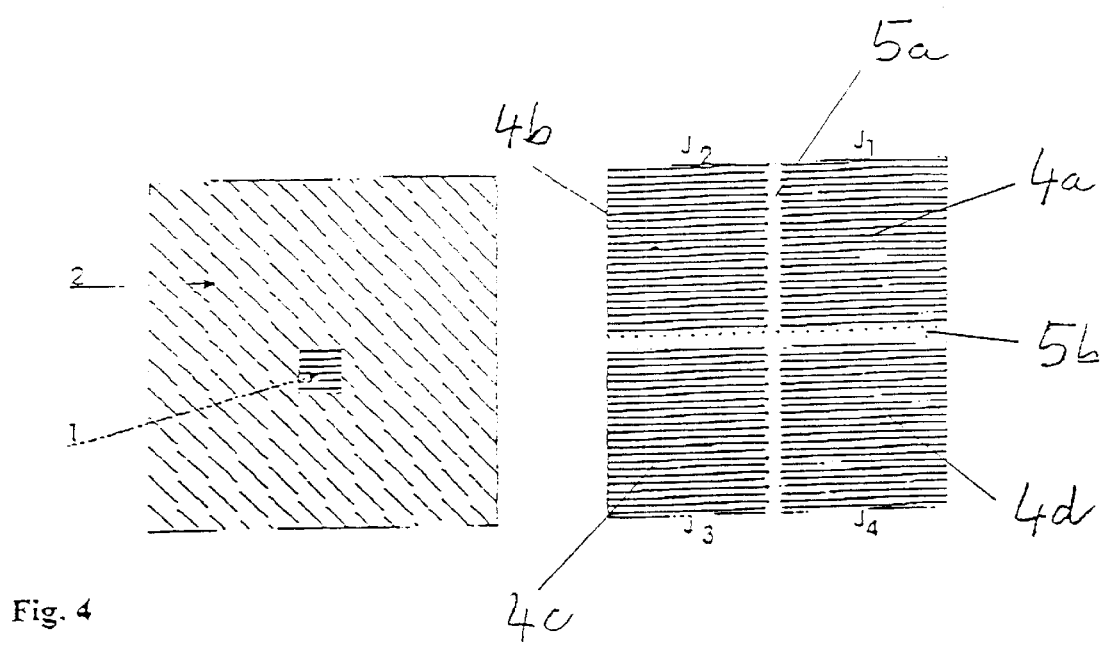
FIG. 4 an alternative embodiment of the sensor according to the invention for measuring a magnetic field.

FIG. 4 now shows an alternative embodiment of the sensor according to the invention for measuring a magnetic field. In this case, the anode layer is subdivided into four equally large anode layer areas 4a, b, c, d. The corresponding insulation section 5 consists of two strips 5a and 5b crossing at right angles. The injector area 1 in the cathode layer 2 is now in form of a square surface which is situated directly opposite the point of intersection of the insulation sections 5a and 5b.

With this, it is possible to determine both components of a magnetic field at right angles to the direction of expansion of the electron beam 9. The currents $J_1$, $J_2$, $J_3$ and $J_4$ of the anode layer areas 4a, 4b, 4c and/or 4d are also measured. To determine one of the magnetic field components, the difference $J_r - J_u$ is formed and to determine the other component, the difference $J_o - J_u$ is formed. In this case, if the corresponding references of the currents are taken from FIG. 4:

$$J_r = J_1 + J_4 \qquad (11)$$

$$J_1 = J_2 + J_3 \qquad (12)$$

$$J_o = J_1 + J_2 \qquad (13)$$

$$J_u = J_3 + J_4 \qquad (14)$$

If there is no magnetic field, then all four sum currents of the equations (11) to (14) are equal in the symmetrical arrangement shown and thus the difference currents $J_r - J_1$ and $J_o - J_u$ are equal to zero.

What is claim is:

1. Sensor for measuring a magnetic field, consisting of several electrically semiconductive layers, characterized therein
that it comprises a packet of directly successive planar semiconductive layers which form a diode connected in reverse direction consisting of
a cathode layer,
an anode layer and
an intrinsically conductive layer enclosed between the two, wherein
the anode layer is subdivided into several anode layer areas insulated from one another by insulation sections;
the cathode layer which, in the area which is opposite the insulation sections on the anode layer, exhibits an injector area that is oppositely doped,
the injector area in the cathode layer is connected with an injection voltage source;
the cathode layer is connected with an inverse voltage source and
the anode layer areas are each earthed via current measuring devices.

2. Sensor according to claim 1,
characterized in
that the cathode layer consists of a p$^+$ doped layer
the anode layer consists of an n$^+$ doped layer, and
the injector area consists of an n$^+$ doped layer.

3. Sensor according to claim 1,
characterized in
that the cathode layer consists of an n$^+$ doped layer
the anode layer consists of a p$^+$ doped layer, and
the injector area consists of a p$^+$ doped layer.

4. Sensor according to claim 1,
characterized in
that the anode layer is subdivided into two parallel anode layer areas by a strip-shaped insulation section.

5. Sensor according to claim 1,
characterized in
that the anode layer is subdivided into four parallel anode layer areas by two strip-shaped insulation sections that cross one another at right angles.

6. Sensor according to claim 1,
characterized in
that said sensor is made from a high-quality semiconductor material with low doping and high mobility of holes and electrons.

7. Sensor according to claim 1,
characterized in
that it is made of silicon.

8. Sensor according to claim 1,
characterized in
that said sensor is made of a semiconductive material that has elements from the III$^{rd}$ main group and elements from the V$^{th}$ main group of the periodical system of elements.

* * * * *